United States Patent
Yamada (10) Patent No.: US 7,450,427 B2
(45) Date of Patent: Nov. 11, 2008

(54) NON-VOLATILE SEMICONDUCTOR MEMORY DEVICE

(75) Inventor: Junichi Yamada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/523,550

(22) Filed: Sep. 20, 2006

(65) Prior Publication Data

US 2007/0064479 A1    Mar. 22, 2007

(30) Foreign Application Priority Data

Sep. 22, 2005   (JP)   ............... 2005-275848

(51) Int. Cl.
*G11C 16/06*   (2006.01)
(52) U.S. Cl. ............... 365/185.2; 365/185.21; 365/203; 365/210
(58) Field of Classification Search ............... 365/185.2, 365/185.21, 203, 210, 189.07, 189.09, 233
See application file for complete search history.

(56) References Cited

U.S. PATENT DOCUMENTS

| | | | | |
|---|---|---|---|---|
| 5,717,640 | A * | 2/1998 | Hashimoto | ............. 365/189.07 |
| 6,094,374 | A * | 7/2000 | Sudo | ..................... 365/185.22 |
| 6,128,226 | A | 10/2000 | Eitan et al. | |
| 6,438,035 | B2 * | 8/2002 | Yamamoto et al. | ...... 365/185.21 |
| 6,625,062 | B2 * | 9/2003 | Won et al. | ............. 365/185.21 |

FOREIGN PATENT DOCUMENTS

JP       2001-357687 A      12/2001

* cited by examiner

*Primary Examiner*—David Lam
(74) *Attorney, Agent, or Firm*—Sughrue Mion, PLLC (57) ABSTRACT

A non-volatile semiconductor memory device includes a memory cell, and a reference cell including a same structure as the memory cell. A detecting circuit detects a timing when a voltage of a reference bit line connected with the reference cell becomes lower than or equal to a setting voltage, and generates a control signal in response to the detection of the timing. A sense amplifier senses and amplifies a difference between a voltage of a bit line connected with the memory cell and a reference voltage in response to the control signal.

18 Claims, 5 Drawing Sheets

NON-VOLATILE SEMICONDUCTOR MEMORY DEVICE

BACKGROUND OF THE INVENTION

1. Field of the Invention

The present invention relates to a non-volatile semiconductor memory device.

2. Description of the Related Art

A dynamic sense amplifier can be configured by using a same type of transistor as that of a usual logic circuit and can be operated in a same power source voltage. Thus, the dynamic sense amplifier has a feature that its chip area can be reduced to a small size. However, the dynamic sense amplifier operates erroneously unless the operation is started after a sufficient differential voltage (signal voltage) equal to or larger than an operational margin of the sense amplifier is generated on an input side of the sense amplifier (an input end of a bit line voltage and an input end of a reference voltage). Thus, in order to avoid the erroneous operation, it is necessary to wait until the generation of the sufficient differential signal voltage. However, the wait time depends on the memory cell characteristic that is varied with deviation in a manufacturing process and the change in an operational temperature. For this reason, in order to avoid the reduction in the production yield, a timing design must be typically carried out to be adaptive to the worst memory cell characteristic. Thus, even if the characteristic of the manufactured memory cell is improved, an access time is not improved (a high speed operation cannot be attained) unless the timing design is changed. That is, attainment of both the high manufacturing yield and the high speed operation was difficult.

Conventionally, Japanese Laid Open Patent Application (JP-P 2001-357687A, a first conventional example) and U.S. Pat. No. 6,128,226 (a second conventional example) are known as a technique for generating a sense amplifier activation or deactivation signal to carry out a control so that the operation timing of the dynamic sense amplifier becomes optimal.

In the first conventional example, a non-volatile semiconductor memory device is disclosed. In this non-volatile semiconductor memory device, a reference cell is prepared which is set to an intermediate threshold voltage between a written state and an erased state in a memory cell. A bit line and a reference bit line are precharged in advance by a precharging circuit. The voltages of the bit line and the reference bit line are reduced based on the states of the memory cell and the reference cell, respectively. When the voltages of the bit line and the reference bit line become sufficiently low voltages, the outputs of the sense amplifier and the reference cell sense amplifier are respectively inverted. However, the threshold voltage of the reference cell is higher than the threshold voltage of the memory cell in the erased state. For this reason, when the memory cell is in the erased state, the output of the sense amplifier is inverted earlier than the reference cell sense amplifier. On the other hand, when the memory cell is in the written state, even if the output of the reference cell sense amplifier is inverted, the output of the sense amplifier is not still inverted. Thus, the timing when the reference cell sense amplifier is inverted is defined as the timing of a sensing completion. Consequently, a read operation from the memory cell is normally carried out. The timing of the sensing start of the sense amplifier corresponds to the completion of the precharging of the bit line.

In the second conventional example, an apparatus is disclosed for sensing a signal from a memory cell in a memory cell array. In this apparatus, a sense amplifier compares a bit line voltage ($V_{cell\text{-}erased}$ or $V_{cell\text{-}programmed}$) read from the memory cell with a reference voltage to determine a data stored in the memory cell. The determination of the data is carried out at a timing of a sense amplifier activation signal $\phi 2$. The reference voltage is generated by a reference voltage generating circuit (Reference Unit). The reference voltage is obtained when the current flowing through the reference cell which has the same structure as the memory cell and is in an erased state charges the parasitic capacitance equal to two or three times of that of the bit line. The sense amplifier activation signal $\phi 2$ is generated through the comparison between a voltage $V_{timer}$, which is obtained when the current flowing through the timing generating reference cell that has the same structure as the memory cell and is in the erased state charges a capacitance Ct, and a voltage $V_{dc\text{-}ref}$ which is a constant voltage.

However, the non-volatile semiconductor memory device of the first conventional example requires the dedicated reference cell in order to generate the timing when the sense amplifier is deactivated. Also, the reference cell is required to be set to a dedicated intermediate potential. For this reason, the dedicated writing circuit, verifying circuit and sequence circuit are required. That is, the circuit configuration becomes complicated. Also, the timing when the data is determined is the timing when a control signal indicating the timing of a sensing completion is generated. This is because the timing is determined based on the magnitude of the on-current of the reference cell, namely, the reduction rate of the bit line voltage. That is, the operation speed of the sensing is determined based on the on-current of the reference cell whose voltage is set to be higher than the threshold voltage of the cell in the erased state. For this reason, the read operation speed becomes slow.

On the other hand, the apparatus in the second conventional example requires the dedicated reference cell in order to generate the timing for the activation or deactivation of the sense amplifier. Also, the timing generation reference cell does not exist in the memory cell array. For this reason, the manufacturing variation to the timing generation reference cell differs from that of the memory cell. That is, although the capacitance associated with the memory cell is a parasitic capacitance on the bit line, the timing generating circuit charges a capacitor of the capacitance Ct. Thus, it is difficult to generate the optimal timing in accordance with the process dependent deviation and the temperature dependent variation. Similarly, the reference cell of the reference voltage generating circuit does not exist in the memory cell array. For this reason, the manufacturing variation received by the reference cell differs from that of the memory cell. Therefore, when the sense amplifier activation signal $\phi 2$ is generated, there is no insurance that the sufficient differential signal voltage (the difference between the bit line voltage and the reference voltage) is obtained.

SUMMARY OF THE INVENTION

Therefore, an object of the present invention is to provide a semiconductor memory device in which timing when a sense amplifier is activated can be controlled based on a property of a memory cell.

In an aspect of the present invention, a non-volatile semiconductor memory device includes a memory cell, and a reference cell including a same structure as the memory cell. A detecting circuit detects timing when a voltage of a reference bit line connected with the reference cell becomes lower than or equal to a setting voltage, and generates a control signal in response to the detection of the timing. A sense amplifier senses and amplifies a difference between a voltage of a bit line connected with the memory cell and a reference voltage in response to the control signal.

Here, the reference cell has a same electric current supply capability as a larger one of electric current supply capability of the memory cell in which a data is written and electric current supply capability of the memory cell from which the data is erased.

Also, the setting voltage is preferably equal to the reference voltage.

Also, the detecting circuit may include a comparing circuit configured to compare the voltage on the reference bit line and the setting voltage and to generate the control signal when the reference bit line voltage becomes lower than the setting voltage.

Also, the non-volatile semiconductor memory device may further include a delay circuit provided between the detecting circuit and the sense amplifier.

Also, the non-volatile semiconductor memory device may further include a precharging circuit configured to precharge the reference bit line to a precharge voltage. The voltage of the reference bit line is reduced when the reference cell is selected.

Also, the precharging circuit precharges the bit line to the precharge voltage, and the voltage of the bit line is reduced when the memory cell is selected.

In another aspect of the present invention, an operation method of a non-volatile semiconductor memory device, is achieved by precharging a reference bit line connected with a reference cell which includes a same structure as a memory cell, to a precharge voltage; by applying a read voltage to a word line connected with the reference cell in response to the precharge of the reference bit line; by detecting that a voltage of the reference bit line is reduced to be equal to or lower than the setting voltage; and by driving a sense amplifier of the memory cell in response to the detection.

Here, the precharging may be achieved by precharging a bit line connected with the memory cell to the precharge voltage. The applying may be achieved by applying the read voltage to the word line connected with the memory cell in response to the precharge of the bit line. The driving may be achieved by reading out data from the memory cell by the sense amplifier based on a voltage on the bit line and a reference voltage.

Also, the reference cell may have an electric current supply capability which is same as a larger one of an electric current supply capability of the memory cell in which a data has been written and that of the memory cell from which the data has been erased.

Also, the setting voltage may be equal to the reference voltage supplied to the sense amplifier.

Also, the driving may be achieved by driving the sense amplifier after the detection by a predetermined time.

DESCRIPTION OF THE PREFERRED EMBODIMENTS

Hereinafter, a non-volatile semiconductor memory device of the present invention will be described in detail with reference to the attached drawings.

Figure 1:
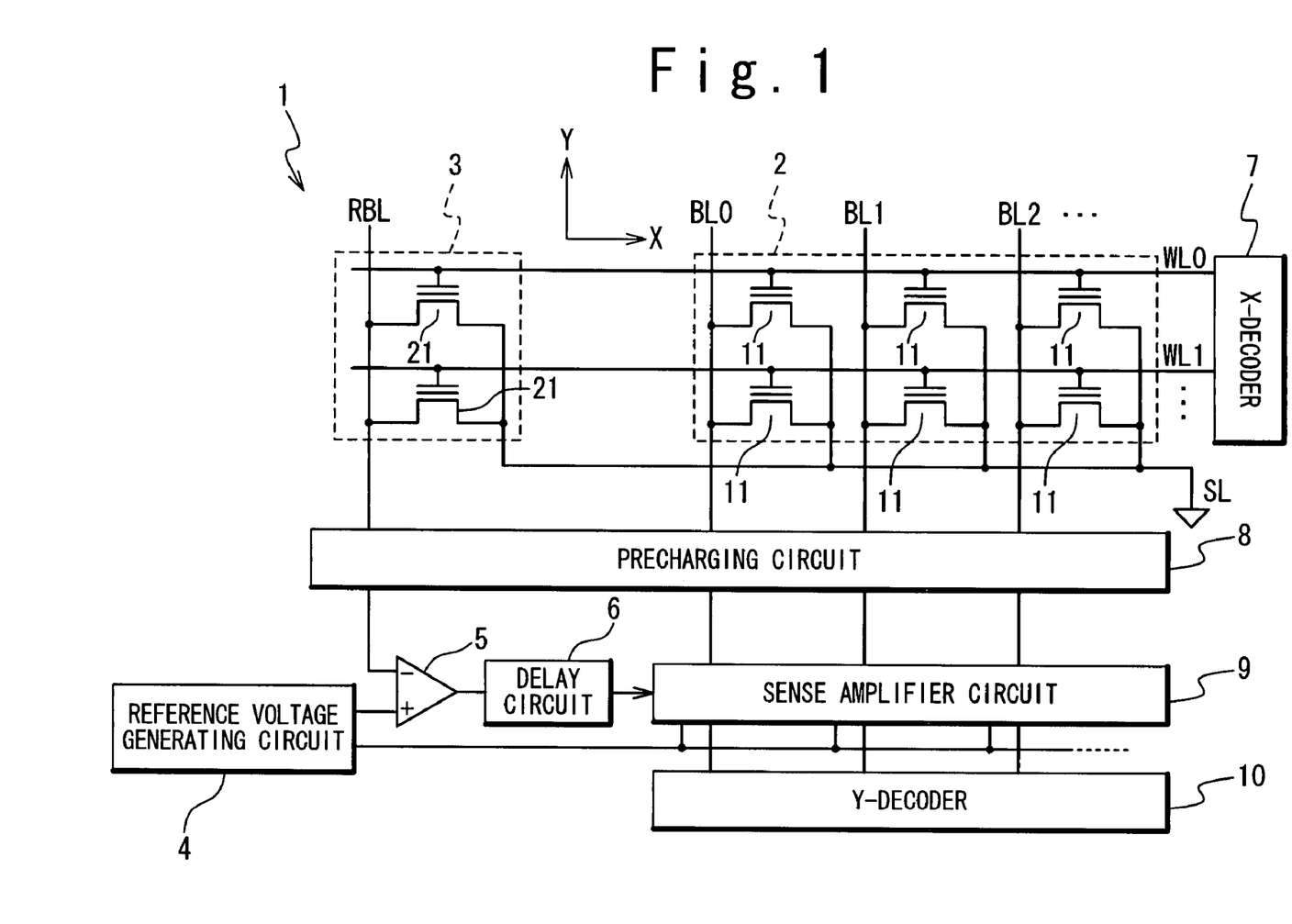
FIG. 1 is a block diagram showing a configuration of an embodiment of a non-volatile semiconductor memory device of the present invention.

At first, the configuration of the non-volatile semiconductor memory device according to an embodiment of the present invention will be described. FIG. 1 is a block diagram showing the configuration of the non-volatile semiconductor memory device according to the embodiments of the present invention. Referring to FIG. 1, the non-volatile semiconductor memory device 1 is provided with a memory cell array 2, a reference column 3, a reference voltage generating circuit 4, a comparator 5, a delay circuit 6, an X-decoder 7, a precharging circuit 8, a sense amplifier circuit 9 and a Y-decoder 10.

The memory cell array 2 contains a plurality of bit lines BL0, BL1, . . . , a plurality of word lines WL0, WL1, . . . , a source line SL, and a plurality of memory cells 11. The plurality of bit lines BL0, BL1, . . . extend in a Y-direction in parallel to each other. One end of each of the plurality of bit lines BL0, BL1, . . . is connected to the Y-decoder 10 through the precharging circuit 8 and the sense amplifier circuit 9. The plurality of word lines WL0, WL1, . . . extend in an X-direction in parallel to each other. One end of each of the plurality of word lines WL0, WL1, . . . is connected to the X-decoder 7, and the other end thereof is connected to the reference column 3. The source line SL is connected to sources of the plurality of memory cells 11, and then is connected to a ground. The plurality of memory cells 11 are the non-volatile memory cells such as flash memory cells. They are provided for the respective intersections between the plurality of bit lines BL0, BL1, . . . and the plurality of word lines WL0, WL1, . . . . A control gate of the memory cell 11 is connected to the word line WL corresponding to that memory cell 11. A drain is connected to the bit line BL corresponding to that memory cell 11. A source is connected to the source line SL.

The reference column 3 contains a reference bit line RBL, the plurality of word lines WL0, WL1, . . . , a reference source line SL, and a plurality of reference cells 21. The reference bit line RBL extends in the Y-direction in parallel to the bit lines BL. One end of the reference bit line RBL is connected to the comparator 5 through the precharging circuit 8. The plurality of word lines WL0, WL1, . . . are equal to the plurality of word lines WL0, WL1, . . . of the memory cell array 2. In the reference source line RSL, one end thereof is connected to sources of the plurality of memory cells 21, and the other end is connected to the ground. The plurality of reference cells 21 are the non-volatile memories such as the flash memory cells having the same structures as the memory cells 11. They are provided for the respective intersections between the reference bit line RBL and the plurality of word lines WL0, WL1, . . . . A gate of the reference cell 21 is connected to the word line WL corresponding to that reference cell 21. A drain is connected to the reference bit line RBL. A source is connected to the reference source line RSL.

The word lines WL are commonly laid in the memory cell array 2 and the reference column 3. That is, when the memory cell 11 on a certain row is selected on the word line WL, e.g., WL0, the generation timing of a sense amplifier activation signal S/A_enable which is used to perform read access to the memory cell 11 is determined in accordance with the reference cell 21 on the word line WL0.

It is preferable that the memory cell array 2 and the reference column 3 are provided close to each other, and the memory cell 11 and the reference cell 21 have the same structure and are formed in the same process. It is required that the variation in the characteristic (the on-current) of the memory cell 11 which depends on the variation in the process at the time of the formation of the memory cell 11, and the variation in the temperature at the time of the operation is same as the variation in the characteristic (the on-current) of the reference memory cell 21, which depends on the variation in the process in the reference cell 21, and the variation in the temperature at the time of the operation.

The reference voltage generating circuit 4 outputs the same reference voltage $V_{ref}$ as a predetermined constant voltage to the comparator 5 and the sense amplifier circuit 9. In this case, the substantially same reference voltages $V_{ref}$ may be outputted from different two reference voltage generating circuits 4 to the comparator 5 and the sense amplifier circuit 9, respectively.

The comparator 5 compares the reference voltage $V_{ref}$ and a voltage $V_{RBL}$ on the reference bit line RBL, and outputs the sense amplifier activation signal S/A_enable to the delay circuit 6, if the voltage $V_{RBL}$ is equal to or lower than the reference voltage $V_{ref}$. The delay circuit 6 delays the sense amplifier activation signal S/A_enable from the comparator 5 by a predetermined time and then outputs the delayed signal to the sense amplifier circuit 9. The predetermined time is, for example, 1 ns.

The X-decoder 7 selects as a selection word line WL, one from among the plurality of word lines WL0, WL1, . . . at the time of the read operation. Then, a read voltage Vg is applied to the control gate of the memory cell 11 connected to the selection word line WL. The Y-decoder 10 selects as a selection bit line BL, one from among the plurality of bit lines BL0, BL1, . . . at the time of the read operation.

The precharging circuit 8 selects the reference bit line RBL simultaneously with the selection of the selection bit line BL from the plurality of bit lines BL0, BL1, . . . . Then, in the read operation of the memory cell 11 connected to the selection bit line BL, the selection bit line BL and the reference bit line RBL are precharged to a predetermined precharge voltage $V_{pre}$.

The sense amplifier circuit 9 reads the data of the memory cell 11 in accordance with the reference voltage $V_{ref}$ and a second voltage $V_{BL}$ of the bit line BL, which is connected to the memory cell 11 and precharged to the precharge voltage $V_{pre}$, in response to the sense amplifier activation signal S/A_enable. The sense amplifier circuit 9 is a dynamic sense amplifier of a voltage comparison type, for example.

Figure 2:
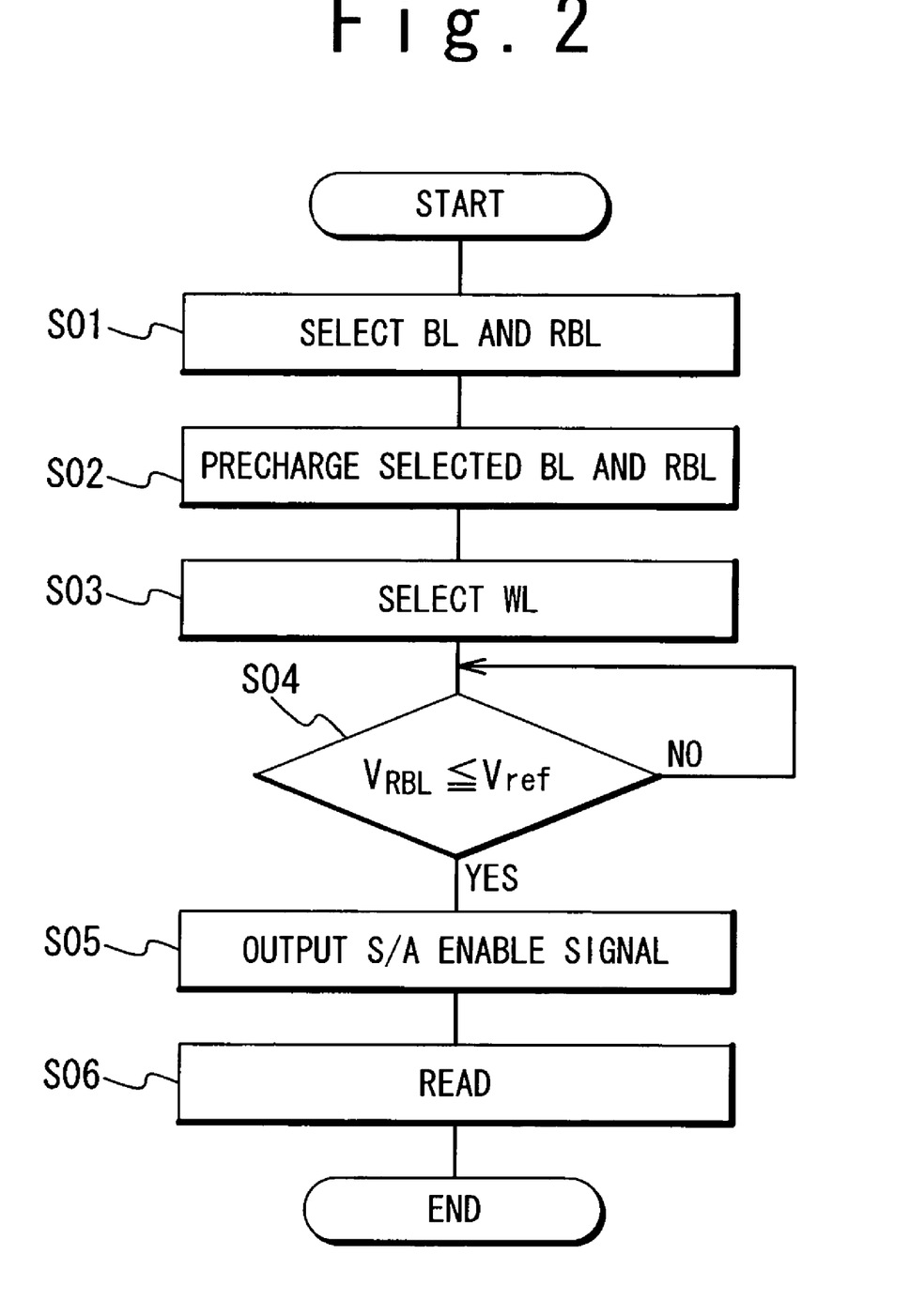
FIG. 2 is a flowchart showing an operation of the embodiment of the non-volatile semiconductor memory device of the present invention.

The operation of the non-volatile semiconductor memory device according to the embodiment of the present invention will be described below with reference to FIGS. 1 and 2. FIG. 2 is a flowchart showing the operation of the non-volatile semiconductor memory device according to the embodiment of the present invention. Here, a case that the read operation is carried out to the memory cell 11 located at the intersection between the bit line BL0 and the word line WL0 will be described. However, the read method is similar in the other memory cells 11.

(1) Step S01:
At first, the precharging circuit 8 selects the reference bit line RBL simultaneously with the selection of the bit line BL0.

(2) Step S02:
Next, the precharging circuit 8 precharges the bit line BL0 to the precharge voltage $V_{pre}$ as a second voltage $V_{BL}$, and at the same time, precharges the reference bit line RBL to the precharge voltage $V_{pre}$ as the first voltage $V_{RBL}$.

(3) Step S03:
In succession, in response to the precharging to the reference bit line RBL and the bit line BL, the X-decoder 7 selects the word line WL0 and applies the read voltage Vg to the control gates of the reference cell 21 and the memory cell 11.

(4) Step S04:
At this time, the reference cell 21 is in the erased state in which any data is not written. Thus, the application of the read voltage Vg turns on the reference cell 21. Therefore, the on-current flows through the reference cell 21. The first voltage $V_{RBL}$ on the reference bit line RBL is sharply dropped with the flow of the on-current. The comparator 5 compares the first voltage $V_{RBL}$ with the reference voltage $V_{ref}$ (constant value) and detects the timing when a relation of the first voltage $V_{RBL} \leq$ the reference voltage $V_{ref}$ (constant value) is met. At this time, the memory cell 11 is in the erased state or the written state. If the memory cell 11 is in the erased state, the application of the read voltage Vg turns on the memory cell 11. Thus, the on-current flows through the memory cell 11. The second voltage $V_{BL}$ on the bit line BL is dropped as the on-current flows. The change in the second voltage $V_{BL}$ in case of this erased state is same as the change in the first voltage $V_{RBL}$, and they proceed in the substantially simultaneous manner.

On the other hand, if the memory cell 11 is in the written state, even the application of the read voltage Vg does not turn on the memory cell 11. That is, the memory cell 11 is in an off-state. However, since leakage current flows from the memory cell 11 or the bit line BL, the second voltage $V_{BL}$ on the bit line BL is gently dropped. In this way, the change in the second voltage $V_{BL}$ is different, depending on the data stored in the memory cell 11. The change in the second voltage $V_{BL}$ in case of this written state differs from the change in the first voltage $V_{RBL}$. That is, although the first voltage $V_{RBL}$ is sharply dropped, the second voltage $V_{BL}$ is gently dropped.

(5) Step S05:
Then, if satisfaction of the relation of the first voltage $V_{RBL} \leq$ the reference voltage $V_{ref}$ is detected for the first voltage $V_{RBL}$ on the reference bit line RBL, the comparator 5 outputs the sense amplifier activation signal S/A_enable to the delay circuit 6. The delay circuit 6 delays the signal by a predetermined delay time, and outputs the sense amplifier activation signal S/A_enable to the sense amplifier circuit 9.

(6) Step S06
The sense amplifier circuit 9 compares the second voltage $V_{BL}$ of the bit line BL with the reference voltage $V_{ref}$ (constant value) in response to the sense amplifier activation signal S/A_enable. Then, the sense amplifier circuit 9 determines the data of the memory cell 11 in accordance with the difference between the second voltage $V_{BL}$ of the bit line BL with the reference voltage $V_{ref}$ and outputs the determination result.

Figure 3:
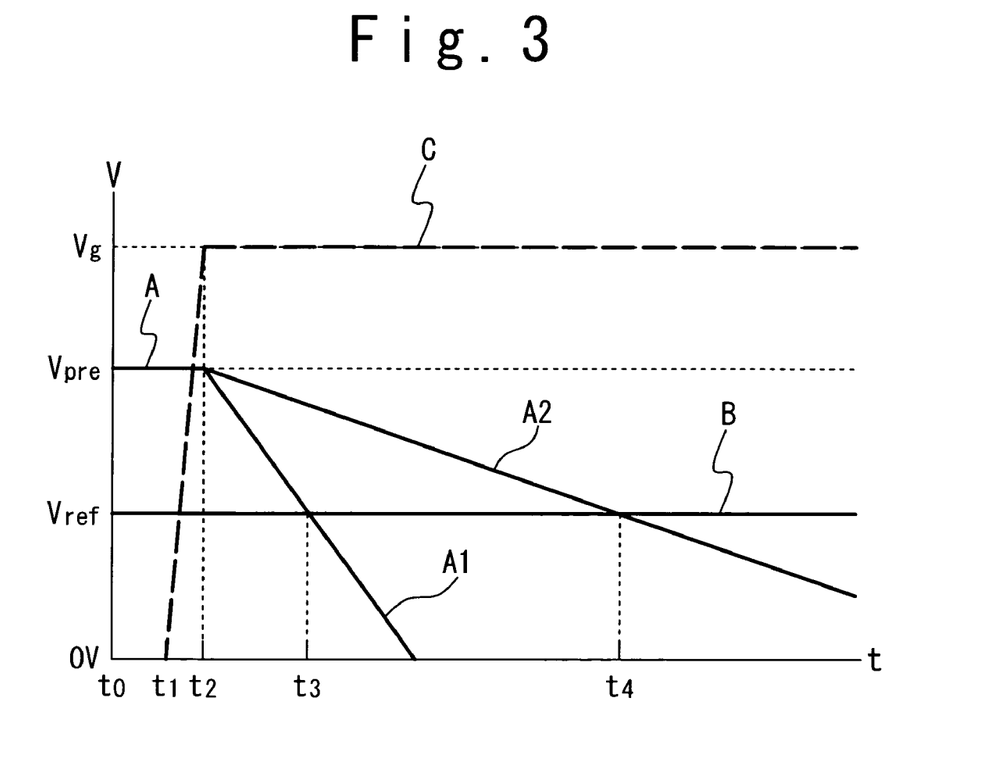
FIG. 3 is a graph showing an embodiment of an operating method of the non-volatile semiconductor memory device.

FIG. 3 is a graph showing the operation of the non-volatile semiconductor memory device. The vertical axis indicates the voltage, and the horizontal axis indicates the time. FIG. 3 simultaneously shows both of the operation for outputting the sense amplifier activation signal S/A_enable with regard to the reference cell 21 and the operation for reading the data stored in the memory cell 11.

At first, the operation for outputting the sense amplifier activation signal S/A_enable with regard to the reference cell 21 will be described. Here, a curve A-A1 indicates the first voltage $V_{RBL}$ on the reference bit line RBL. A curve B indicates the reference voltage $V_{ref}$ which is supplied to the comparator 5 by the reference voltage generating circuit 4. A curve C indicates the voltage of the word line WL. A curve A2 is neglected.

A time t0 indicates the step S02. With reference to the curve A, the first voltage $V_{RBL}$ on the reference bit line RBL is equal to the precharge voltage $V_{pre}$. With reference to the curve B, the reference voltage $V_{ref}$ is supplied to the comparator 5.

The time between t1 and t2 indicates the step S03. With reference to the curve C, the read voltage Vg is applied to the control gate of the memory cell 11 and the control gate of the reference cell 21 through the word line WL.

The time between t2 and t3 indicates the step S04. The application of the read voltage Vg turns on the reference cell 21, and the on-current flows through the reference cell 21. Thus, the first voltage $V_{RBL}$ on the reference bit line RBL is dropped rapidly with the flow of the on-current, as shown by the curve A1.

The time t3 indicates the step SO5. With regard to the first voltage $V_{RBL}$ on the reference bit line RBL, if the satisfaction of the relation of the first voltage $V_{RBL} \leq$ the reference voltage $V_{ref}$ is detected as shown by the curve A1, the comparator 5 outputs the sense amplifier activation signal S/A_enable.

Next, the operation for reading the data stored in the memory cell 11 will be described below. The curve A-A1 indicates the second voltage $V_{BL}$ on the bit line BL when the memory cell 11 is in the erased state. The curve A-A2 indicates the second voltage $V_{BL}$ on the bit line BL when the memory cell 11 is in the written state. The curve B indicates the reference voltage $V_{ref}$ which is supplied to the sense amplifier circuit 9 by the reference voltage generating circuit 4. The curve C indicates the voltage on the word line WL.

The time t0 indicates the step S02. With reference to the curve A, the second voltage $V_{BL}$ on the bit line BL0 is equal to the precharge voltage $V_{pre}$. With reference to the curve B, the reference voltage $V_{ref}$ is supplied to the sense amplifier circuit 9.

The time between t1 and t2 indicates the step S03. With reference the curve C, the read voltage Vg is applied to the control gate of the reference cell 21 and the control gate of the memory cell 11 through the word line WL.

The time between t2 and t3 indicates the step S04. The application of the read voltage Vg turns on the memory cell 11 in case of the erased state, and the on-current flows. Thus, the second voltage $V_{BL}$ on the bit line BL is dropped rapidly with the flow of the on-current, as shown by the curve A1. On the other hand, in case of the written state, the memory cell 11 is not turned on. However, the leakage current from the memory cell 11 or bit line BL causes the on-current to be slightly flowed. Consequently, the second voltage $V_{BL}$ on the bit line BL is dropped gently as shown by the curve A2.

The time between t3 and t4 indicates the step S06. The sense amplifier activation signal S/A_enable is outputted by the comparator 5 at the time t3 and delayed by the predetermined time by the delay circuit 6. Then, the delayed sense amplifier activation signal S/A_enable is supplied to the sense amplifier circuit 9 at the predetermined time after the time t3. The sense amplifier circuit 9 carries out the sensing operation in response to the sense amplifier activation signal S/A_enable. That is, if the memory cell 11 is in the erased state, the sense amplifier circuit 9 detects the relation of the reference voltage $V_{ref}>$ the second voltage $V_{BL}$ based on the second voltage $V_{BL}$ on the bit line BL shown by the curve A1. Thus, for example, [0] is determined. If the memory cell 11 is in the written state, the sense amplifier circuit 9 detects the relation of the reference voltage $V_{ref}<$ the second voltage $V_{BL}$ based on the second voltage $V_{BL}$ on the bit line BL shown by the curve A2. Thus, for example, [1] is determined. The sense amplifier circuit 9 outputs the judgment result.

The operation of generating the sense amplifier activation signal S/A_enable related to the reference cell 21 and the operation of reading the data stored in the memory cell 11 are both carried out at the same time in parallel, as mentioned above.

In the above-mentioned processes, if the sensing operation is carried out between the times t2 and t3 after the selection of the word line WL, the sense amplifier circuit 9 detects the relation of the reference voltage $V_{ref}<$ the second voltage $V_{BL}$ even in any of the erased and written states of the memory cell 11. In addition, if the sensing operation is carried out after the time t4, the sense amplifier circuit 9 detects the relation of the reference voltage $V_{ref}>$ the second voltage $V_{BL}$ even in any of the erased and written states of the memory cell 11. As this result, in any case, the read operation becomes erroneous. That is, in order to carry out the correct sensing operation, the sense amplifier circuit 9 must carry out the sensing operation during the sensible period between the times t3 and t4, and not during the erroneous operation period between the times t2 and t3.

The present invention uses the reference cell 21 having the same structure as the memory cell 11. Thus, as mentioned above, the relation of the first voltage $V_{RBL}$ ($\approx$the second voltage $V_{BL}$)$\leq$the reference voltage $V_{ref}$ is detected at the time t3. Then, the comparator 5 outputs the sense amplifier activation signal S/A_enable. Therefore, between the times t3 and t4 during which the correct operation is possible, the sense amplifier circuit 9 can carry out the sensing operation. At this time, the sensing operation is designed so as to be carried out after the elapse of the proper time after the time t3 and not immediately after the time t3, by passing through the delay circuit 6. Consequently, the reliability of the sensing operation can be made higher.

Figure 4:
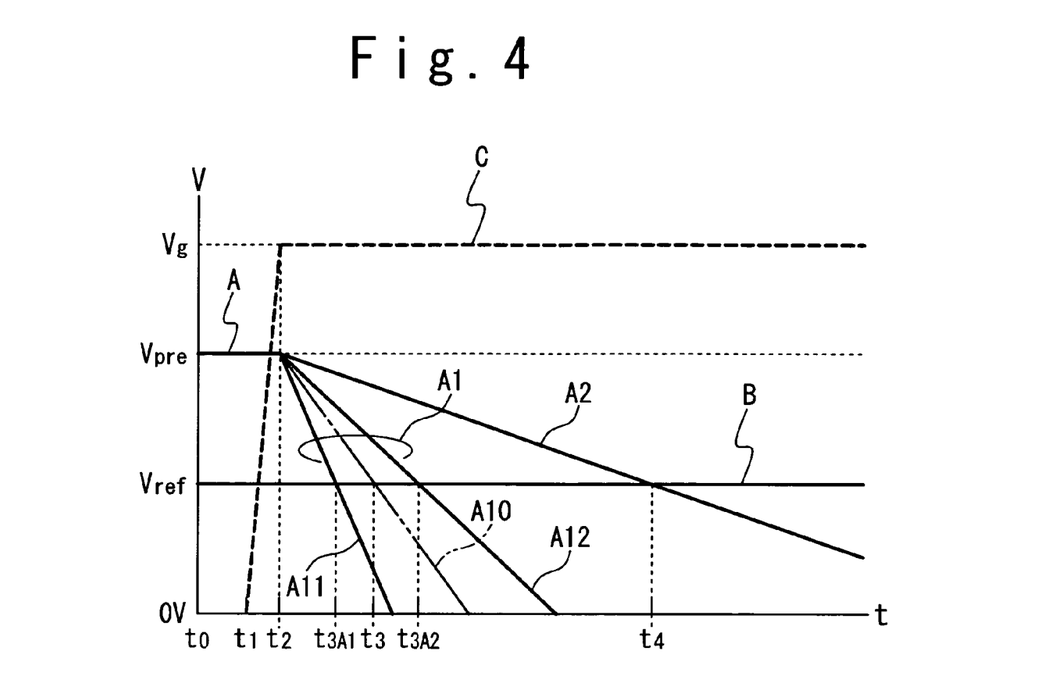
FIG. 4 is a graph showing the relation between the operation method of the non-volatile semiconductor memory device and the variation in a cell characteristic.

FIGS. 4 and 5A to 5C are a graph and timing charts showing the relation between the operation of the non-volatile semiconductor memory device and the variation in the cell characteristic. FIG. 4 is basically similar to FIG. 3, and shows both of the operation for outputting the sense amplifier activation signal S/A_enable related to the reference cell 21 and the operation for reading the data stored in the memory cell 11. However, the curve A-A1 of FIG. 3 is represented by the curve A-A10. In addition, the curve A-A11 and the curve A-A12 are shown for variation in the characteristics of the reference cell 21 and the memory cell 11.

Figure 5A:
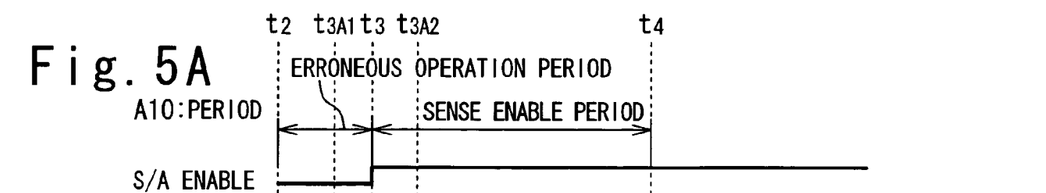
FIGS. 5A to 5C are timing charts showing S/A enable signals in FIG. 4.
Figure 5B:
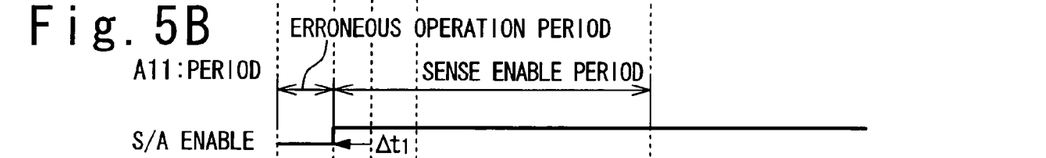
Figure 5C:
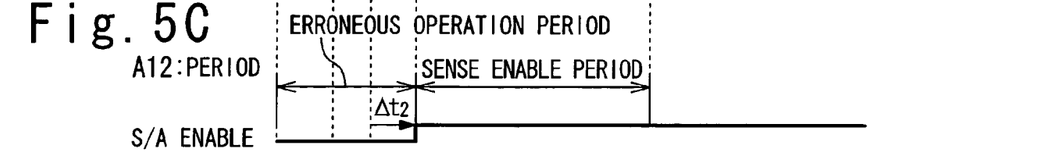

FIGS. 5A to 5C show the timing charts of the sense amplifier activation signal S/A_enable in cases of the curve A-A10, the curve A-A11 and the curve A-A12, respectively. The curve A-A10 shown in FIG. 4 and FIG. 5A show the case of the curve A-A1 in FIG. 3. After the period between t2 and t3 that is an erroneous operation period, at the time t3, the sense amplifier activation signal S/A_enable is outputted from the comparator 5. Thus, the data of the memory cell 11 is sensed between the times t3 and t4.

The curve A-A11 in FIG. 4 and FIG. 5B show a case that the variation in the characteristics of the reference cell 21 and the memory cell 11 causes the change in the on-current to become slightly sharp. Such change is caused not only in one of the reference cell 21 and the memory cell 11, but also in both of them. This is because the reference cell 21 and the memory cell 11 are formed at the same time in the substantially same regions to have the same structure. In this case, the times when the first voltage $V_{RBL}$ of the reference bit line RBL and the second voltage $V_{BL}$ of the bit line BL become a voltage equal to or lower than the reference voltage $V_{ref}$ are both made earlier by Δt1. Thus, the erroneous operation period is set to a time between the times t2 and t3$_{A1}$. Then, the sense amplifier activation signal S/A_enable is outputted from the comparator 5 at the time t3$_{A1}$. Therefore, between the time t3$_{A1}$ and the time t4, the sense amplifier circuit 9 senses the data of the memory cell 11.

The curve A-A12 in FIG. 4 and FIG. 5C show the case that the variation in the characteristics of the reference cell 21 and the memory cell 11 causes the change in the on-current to become slightly gentler. Also, such change is similarly caused not only in one of the reference cell 21 and the memory cell 11, but also in both of them. This is because the reference cell 21 and the memory cell 11 are formed at the same time in the substantially same regions to have the same structure. In this case, the times when the first voltage V$_{RBL}$ of the reference bit line RBL and the second voltage V$_{BL}$ of the bit line BL become a voltage equal to or lower than the reference voltage V$_{ref}$ are made slower by Δt2. Thus, the erroneous operation period is a period between the times t2 and t3$_{A2}$. Then, the sense amplifier activation signal S/A_enable is outputted from the comparator 5 at the time 3$_{A2}$. Therefore, between the time t3$_{A2}$ and the time t4, the sense amplifier circuit 9 senses the data of the memory cell 11.

In this way, in the present invention, the sense amplifier activation signal is generated by using the reference cell 21, which has the same structure as the memory cell 11 and is formed in the substantially same region at the same time. For this reason, if the manufacturing variation causes the on-characteristic of the memory cell 11 to be changed as compared with the design, the on-characteristic of the reference cell 21 is similarly changed. Thus, without any execution of the design change and the special process, the sense amplifier activation signal can be generated at the timing when it is automatically adjusted to the on-characteristic.

Figure 6:
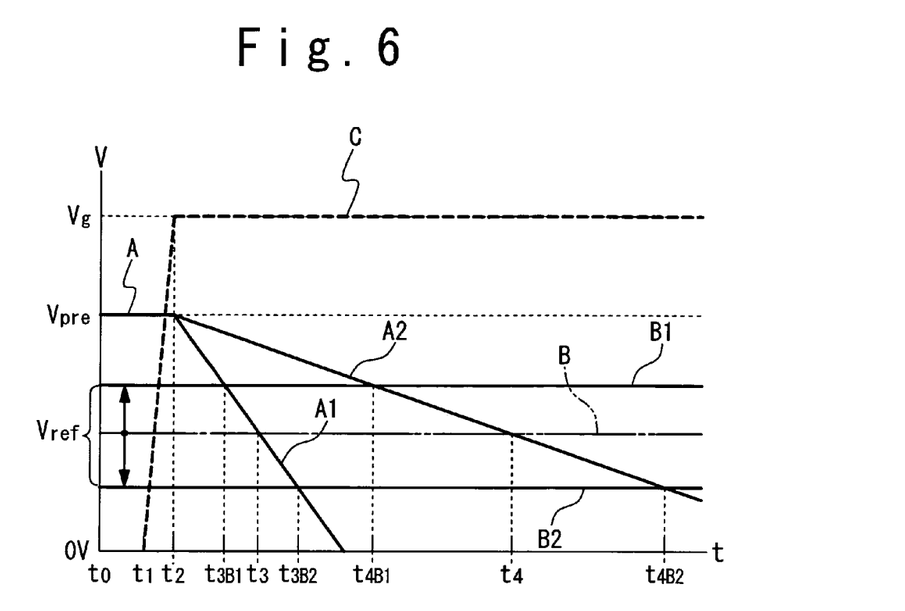
FIG. 6 is a graph showing the relation between the operation method of the non-volatile semiconductor memory device and the variation in a cell characteristic.

FIGS. 6 and 7A to 7C are graphs and timing charts showing another relation between the operation of the non-volatile semiconductor memory device and the variation in the cell characteristic. FIG. 6 is basically similar to FIG. 3, and simultaneously shows both of the operation for outputting the sense amplifier activation signal S/A_enable related to the reference cell 21 and the operation for reading the data stored in the memory cell 11. However, the curve B1 and the curve B2 are shown as the case that the variation in the characteristic of the reference voltage generating circuit 4 causes change in the reference voltage V$_{ref}$.

Figure 7A:
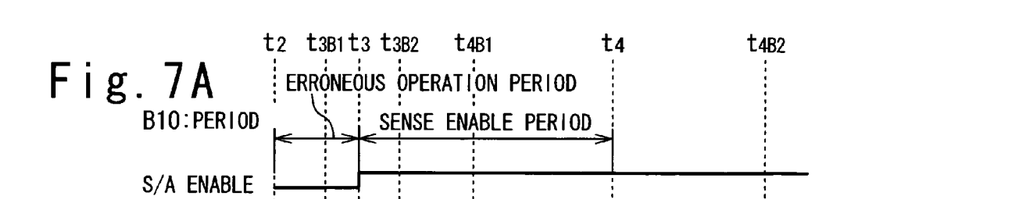
FIGS. 7A to 7C are timing charts showing S/A enable signals in FIG. 6.
Figure 7B:
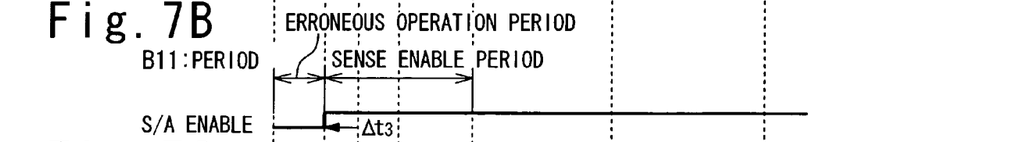
Figure 7C:
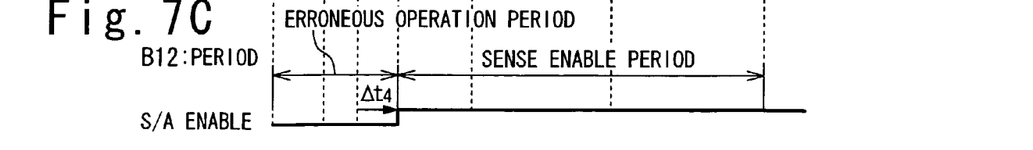

FIGS. 7A to 7C are the timing charts showing the sense amplifier activation signal S/A_enable in case of the curve B, in case of the curve B1 and in case of the curve B2, respectively.

The curve B of FIG. 6 and FIG. 7A are similar to a case of the curve B of FIG. 3. After the period between t2 and t3 which is the erroneous operating period, at the time t3, the sense amplifier activation signal S/A_enable is outputted from the comparator 5. Consequently, the data of the memory cell 11 is sensed between the time t3 and the time t4.

The curve B1 of FIG. 6 and FIG. 7B show a case that the variation in the characteristic of the reference voltage generating circuit 4 causes the reference voltage V$_{ref}$ to become slightly higher. Such change has the similar influence not only on one of the comparator 5 and the sense amplifier circuit 9, but also on the comparing operation between them. This is because the same reference voltage V$_{ref}$ is used in the comparator 5 and the sense amplifier circuit 9. In this case, the times when the first voltage V$_{RBL}$ of the reference bit line RBL and the second voltage V$_{BL}$ of the bit line BL become equal to or lower than the reference voltage V$_{ref}$ are both made earlier by Δt3. Thus, the erroneous operation period becomes between the time t2 and the time t3$_{B1}$. Then, the sense amplifier activation signal S/A_enable is outputted from the comparator 5 at the time t3$_{B1}$. Therefore, the sense amplifier circuit 9 senses the data of the memory cell 11 between the time t3$_{B1}$ and the time t4$_{B1}$.

The curve B2 of FIG. 6 and FIG. 7C show a case that the variation in the characteristic of the reference voltage generating circuit 4 causes the reference voltage V$_{ref}$ to become slightly lower. Such change also has the similar influence not only on one of the comparator 5 and the sense amplifier circuit 9, but also on the comparing operation between them. This is because the same reference voltage V$_{ref}$ is used in the comparator 5 and the sense amplifier circuit 9. In this case, the times when the first voltage V$_{RBL}$ of the reference bit line RBL and the second voltage V$_{BL}$ of the bit line BL become equal to or lower than the reference voltage V$_{ref}$ are both made slower by Δt4. Thus, the erroneous operation period is a period between the time t2 and the time t3$_{B2}$. Then, the sense amplifier activation signal S/A_enable is outputted from the comparator 5 at the time t3$_{B2}$. Therefore, the sense amplifier circuit 9 senses the data of the memory cell 11 between the time t3$_{B2}$ and the time t4$_{B2}$.

In this way, in the present invention, the sense amplifier activation signal is generated by using the reference cell 21, which has the same structure as the memory cell 11 and is formed in the substantially same region at the same time. In addition, the comparator 5 carries out the comparison by using the reference voltage V$_{ref}$ equal to the reference voltage V$_{ref}$ of the sense amplifier circuit 9. For this reason, if the manufacturing variation cause the characteristic of the reference voltage generating circuit 4, which generates the reference voltage V$_{ref}$, to be changed as compared with the design, the reference voltages V$_{ref}$ supplied to the sense amplifier circuit 9 and the comparator 5 are changed at the same time. Thus, the sense amplifier activation signal can be generated at the timing automatically adjusted based on the reference voltage V$_{ref}$ without any execution of the change and the special process. Here, even in the case of using the different two reference voltage generating circuits 4, if the characteristics are changed similarly to each other as compared with the design because they are provided close to each other under the same circuit configuration, the similar effect can be obtained.

According to the present invention, without any reduction in the manufacturing yield, it is possible to minimize one of the access times which is determined in accordance with the characteristic of the memory cell (it is not necessary to carry out the timing design on the basis of the worst cell characteristic). That is, according to the present invention, the timing when the sense amplifier is activated is generated in accordance with the on-current of the memory cell, and when the memory cell characteristic is improved, the access time is automatically made shorter, which can automatically improve the performance, namely, attain the high speed operation. On the other hand, even if the memory cell characteristic becomes degraded, only the access time is automatically made longer, and the erroneous operation is never caused. That is, the sample which has been treated as a defect sample until now is treated as a normal sample. Thus, the reduction in the manufacturing yield can be protected. In order to exhibit its effect more greatly, the reference cell is preferred to be provided inside the memory cell array. In that case, in addition to the configuration where the characteristic (on-current) of the reference cell is made identical to the characteristic of the memory cell, since the combination of the parasitic capacitances of the reference cell and the reference bit line is made identical to the combination of the parasitic capacitances of the memory cell and the bit line, the timing when the sense amplifier is activated can be optimized, which is further preferable.

Also, according to the present invention, the circuit configuration that generates the sense amplifier activation signal S/A_enable can be attained with the simple circuit.

The memory cell (the reference cell 21) for generating the timing of the sense amplifier activation (generating the sense amplifier activation signal S/A_enable) may be the memory cell in the erased state. Thus, it is not necessary to carry out the write operation to the memory cell so that a special threshold voltage is set in advance. Also, it is not necessary to inhibit the erasure of the reference cell 21, even when the data of the memory cell 11 is erased. Also, the reference voltage $V_{ref}$ of the sense amplifier circuit 9 may be the constant voltage. It is not necessary to use a special reference voltage generating circuit, such as the use of a different reference cell, for example, in order to generate the optimal reference voltage in accordance with the cell characteristic. Moreover, the reference voltage $V_{ref}$ may be equal to the reference voltage $V_{ref}$ of the comparator 5 for generating the sense amplifier activation timing. Therefore, several kinds of voltages are not required to be generated.

Moreover, in the present invention, after the reference bit line RBL of the reference cell 21, e.g., an erased bit of the reference column 3 is precharged, the fact that it becomes equal to or lower than the reference voltage $V_{ref}$ lower than the precharge voltage $V_{pre}$ is detected and then the sense amplifier activation signal S/A_enable is generated. Then, the sense amplifier activation signal S/A_enable is delayed by the predetermined time. Consequently, the sense amplifier circuit 9 is activated within the sensible period. At this time, the reference voltage $V_{ref}$ supplied to the sense amplifier of the circuit 9 corresponding to the selection bit line BL in the memory cell array 2 is equal to the voltage $V_{ref}$ supplied to the comparator 5 in the reference column 3. Therefore, even if the reference voltage $V_{ref}$ is changed, the sense amplifier circuit 9 can be always activated at the suitable timing.

Also, since the reference column 3 is formed in the same region as the memory cell array 2 (or, one side of the memory cell array 2), the variation on the device can be reduced, which can further improve the precision in the timing generation. Thus, according to the present invention, at the timing optimal for the memory cell characteristic and under the simple circuit configuration, the sense amplifier activation signal S/A_enable can be generated, which can attain the read operation of the high speed, without any loss of the feature of the dynamic sense amplifier that enables the reduction in the chip area while keeping the high yield.

According to the present invention, it is possible to generate the activation timing optimal for the sense amplifier, correspondingly to the variation in the characteristic (the on-current) of the memory cell with respect to the variation in the manufacturing process and the change in the operation temperature.

What is claimed is:

1. A non-volatile semiconductor memory device comprising:
    a memory cell;
    a reference cell including a same structure as said memory cell;
    a detecting circuit configured to detect a timing when a voltage of a reference bit line connected with said reference cell becomes lower than or equal to a setting voltage, and to generate a control signal in response to the detection of the timing; and
    a sense amplifier configured to sense and amplify a difference between a voltage of a bit line connected with said memory cell and a reference voltage in response to said control signal.

2. The non-volatile semiconductor memory device according to claim 1, wherein said reference cell has a same electric current supply capability as a larger one of electric current supply capability of said memory cell in which a data is written when data is being written and electric current supply capability of said memory cell from which the data is erased when data is being erased.

3. The non-volatile semiconductor memory device according to claim 1, wherein said setting voltage is equal to said reference voltage.

4. The non-volatile semiconductor memory device according to claim 1, further comprising:
    a delay circuit provided between said detecting circuit and said sense amplifier.

5. The non-volatile semiconductor memory device according to claim 1, further comprising:
    a precharging circuit configured to precharge said reference bit line to a precharge voltage,
    wherein the voltage of said reference bit line is reduced when said reference cell is selected.

6. The non-volatile semiconductor memory device according to claim 5, wherein said precharging circuit precharges said bit line to said precharge voltage,
    wherein the voltage of said bit line is reduced when said memory cell is selected.

7. A non-volatile semiconductor memory device comprising:
    a memory cell;
    a reference cell including a same structure as said memory cell;
    a detecting circuit configured to detect a timing when a voltage of a reference bit line connected with said reference cell becomes lower than or equal to a setting voltage, and to generate a control signal in response to the detection of the timing; and
    a sense amplifier configured to sense and amplify a difference between a voltage of a bit line connected with said memory cell and a reference voltage in response to said control signal,
    wherein said detecting circuit comprises:
    a comparing circuit configured to compare the voltage on said reference bit line and said setting voltage and to generate said control signal when said reference bit line voltage becomes lower than said setting voltage.

8. The non-volatile semiconductor memory device according to claim 7, further comprising:
    a reference voltage generating circuit coupled to said comparing circuit and said sense amplifier,
    wherein the reference voltage generating circuit generates said setting voltage and said reference voltage.

9. An operation method of a non-volatile semiconductor memory device, comprising:
    precharging a reference bit line connected with a reference cell which includes a same structure as a memory cell, to a precharge voltage;
    applying a read voltage to a word line connected with said reference cell in response to the precharge of said reference bit line;
    detecting that a voltage of said reference bit line is reduced to be equal to or lower than a setting voltage; and
    driving a sense amplifier of said memory cell in response to said detection.

10. The operation method according to claim 9, wherein said precharging comprises:
  precharging a bit line connected with said memory cell to said precharge voltage,
  said applying comprises:
  applying said read voltage to said word line connected with said memory cell in response to the precharge of said bit line, and
  said driving comprises:
  reading out data from said memory cell by said sense amplifier based on a voltage on said bit line and a reference voltage.

11. The operation method according to claim 10, wherein said setting voltage is equal to said reference voltage supplied to said sense amplifier.

12. The operation method according to claim 10, wherein said setting voltage and said reference voltage are generated by a same voltage generator.

13. The operation method according to claim 9, wherein said reference cell has an electric current supply capability which is same as a larger one of an electric current supply capability of said memory cell in which a data has been written when data is being written and that of said memory cell from which the data has been erased when data is being erased.

14. The operation method according to claim 9, wherein said driving comprises:
  driving said sense amplifier after said detection by a predetermined time.

15. The non-volatile semiconductor memory device according to claim 1, further comprising:
  a reference voltage generating circuit coupled to said detecting circuit and said sense amplifier,
  wherein said reference voltage generating circuit generates said setting voltage and said reference voltage.

16. The non-volatile semiconductor memory device according to claim 15,
  wherein said setting voltage is equal to said reference voltage.

17. A non-volatile semiconductor memory device comprising:
  a memory cell;
  a bit line coupled to said memory cell;
  a reference cell including a same structure as said memory cell;
  a reference bit line coupled to said reference cell;
  a reference voltage generator configured to generate a reference voltage;
  a comparator coupled to said reference bit line and said reference voltage generator, to compare a voltage on said reference bit line with said reference voltage to generate a control signal; and
  a sense amplifier coupled to said bit line, to read out data from said memory cell in response to said control signal.

18. The non-volatile semiconductor memory device according to claim 17, wherein said sense amplifier is coupled to said reference voltage generator and detects a difference between a voltage on said bit line and said reference voltage to read out the data.

* * * * *